United States Patent
Suzuki

(10) Patent No.: US 7,760,254 B2
(45) Date of Patent: Jul. 20, 2010

(54) SINGLE PLATE-TYPE COLOR SOLID-STATE IMAGE SENSING DEVICE

(75) Inventor: Nobuo Suzuki, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 1074 days.

(21) Appl. No.: 11/390,212

(22) Filed: Mar. 28, 2006

(65) Prior Publication Data
US 2006/0215048 A1  Sep. 28, 2006

(30) Foreign Application Priority Data
Mar. 28, 2005  (JP)  ............ P.2005-091732

(51) Int. Cl.
H04N 5/335  (2006.01)

(52) U.S. Cl. .............. 348/272; 348/277; 348/280

(58) Field of Classification Search ......... 348/272–283
See application file for complete search history.

(56) References Cited

U.S. PATENT DOCUMENTS

| | | | |
|---|---|---|---|
| 5,965,875 A * | 10/1999 | Merrill ............ | 250/226 |
| 6,300,612 B1 * | 10/2001 | Yu ............ | 250/208.1 |
| 6,661,459 B1 * | 12/2003 | Koizumi et al. ............ | 348/310 |
| 7,230,226 B2 * | 6/2007 | Inuiya ............ | 250/208.1 |
| 7,411,620 B2 * | 8/2008 | Taniguchi et al. ............ | 348/294 |
| 7,550,797 B2 * | 6/2009 | Suzuki ............ | 257/291 |
| 2003/0086008 A1 * | 5/2003 | Nagano ............ | 348/272 |
| 2003/0193586 A1 * | 10/2003 | Hayakawa ............ | 348/272 |
| 2003/0209651 A1 * | 11/2003 | Iwasaki ............ | 250/214.1 |
| 2004/0100570 A1 * | 5/2004 | Shizukuishi ............ | 348/272 |
| 2004/0130641 A1 * | 7/2004 | Mabuchi ............ | 348/302 |
| 2004/0161868 A1 | 8/2004 | Hong | |
| 2004/0179120 A1 | 9/2004 | Shizukuishi | |
| 2005/0205958 A1 * | 9/2005 | Taniguchi et al. ............ | 257/436 |
| 2005/0206755 A1 * | 9/2005 | Yokoyama et al. ............ | 348/272 |
| 2005/0230775 A1 * | 10/2005 | Watanabe et al. ............ | 257/444 |
| 2007/0058055 A1 * | 3/2007 | Yamaguchi et al. ............ | 348/272 |

FOREIGN PATENT DOCUMENTS

| | | |
|---|---|---|
| JP | 2002-83946 A | 3/2002 |
| JP | 2003-332551 A | 11/2003 |
| JP | 2004-273951 A | 9/2004 |
| WO | WO 99/39372 A2 | 8/1999 |
| WO | WO 99/56097 A1 | 11/1999 |

OTHER PUBLICATIONS

Japanese Office Action dated Feb. 16, 2010, in Application No.: 2005-091732.

* cited by examiner

Primary Examiner—Tuan Ho
Assistant Examiner—Kent Wang
(74) Attorney, Agent, or Firm—Sughrue Mion, PLLC

(57) ABSTRACT

A color solid-state image sensing device including: a semiconductor substrate having a surface portion where high density impurity regions connected to signal reading circuits respectively are formed; a blue light detecting photodiode formed in a shallow portion of the semiconductor substrate; and a red light detecting photodiode formed in a deep portion of the semiconductor substrate, wherein connection regions which are provided so as to be continued to the photodiodes respectively and exposed to the surface of the semiconductor substrate are formed only in portions adjacent to the high density impurity regions so that electric charge accumulated in each photodiode can be transferred to corresponding one of the corresponding high density impurity regions.

24 Claims, 5 Drawing Sheets

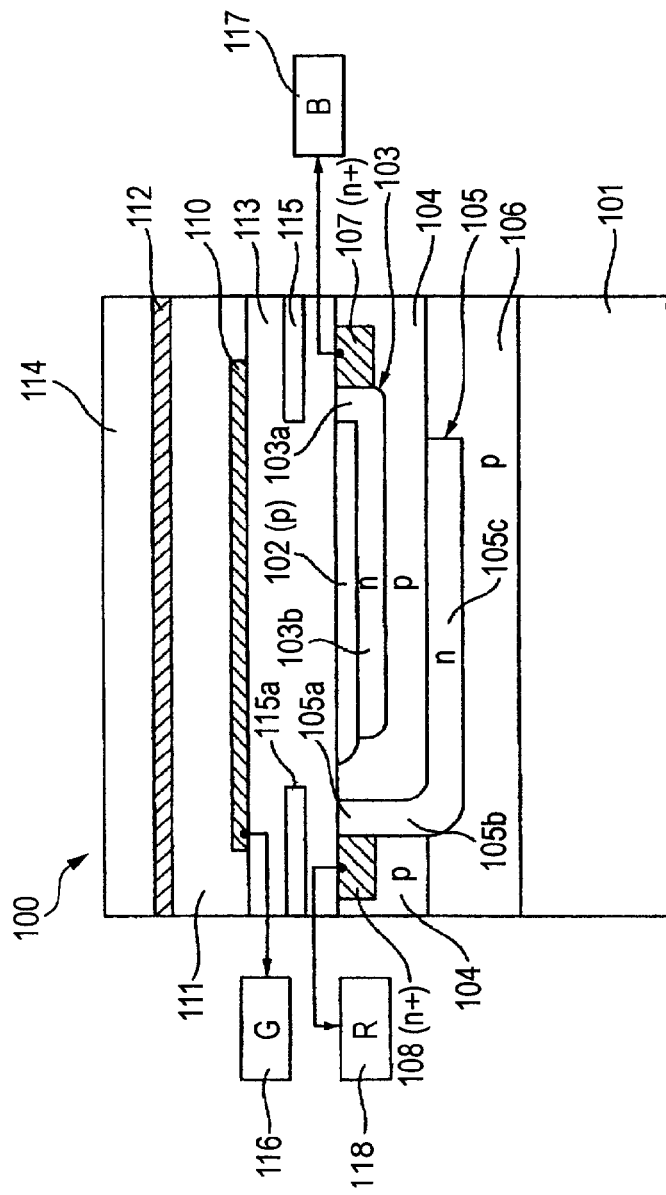
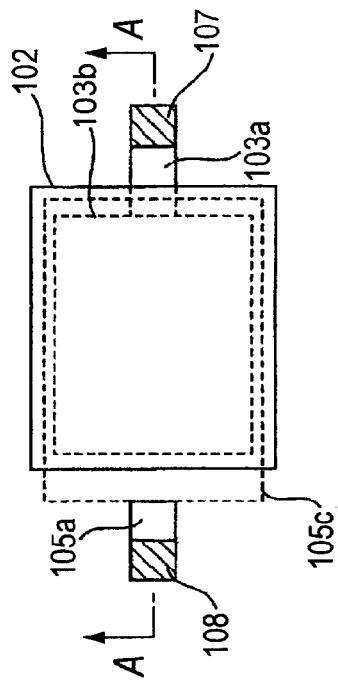

SINGLE PLATE-TYPE COLOR SOLID-STATE IMAGE SENSING DEVICE

FIELD OF THE INVENTION

The present invention relates to a single plate-type color solid-state image sensing device for detecting signals of the three colors of red (R), green (G) and blue (B) per pixel. Particularly, it relates to a single plate-type color solid-state image sensing device which can sense a high-quality color image while dark current is reduced.

BACKGROUND OF THE INVENTION

In a background-art single plate-type color solid-state image sensing device represented by a CCD image sensor or a CMOS image sensor, respective color filters of R, G and B are mounted mosaically on an array of photoelectric conversion pixels (photodiodes). Color signals outputted from the respective pixels of the color solid-state image sensing device in accordance with the color filters are processed to generate a color image.

In the color solid-state image sensing device having the color filters arranged mosaically, when color filters of the three primary colors (R, G and B) are provided as the color filters, each color filter absorbs two thirds of light incident on the color solid-state image sensing device. Accordingly, there is a disadvantage that the color solid-state image sensing device is poor in light utilization efficiency and low in sensitivity. In addition, since a color signal of only one color per pixel can be obtained, there is another disadvantage that the color solid-state image sensing device is poor in resolution and particularly conspicuous in false color.

In order to overcome such disadvantages, therefore, an image sensing device having three layers of photoelectric conversion films laminated, for example, as described in JP-A-2002-502120 (corresponding to WO 99/39372) and JP-A-2002-83946 has been examined and developed. This image sensing device has a pixel structure in which, for example, three layers of photoelectric conversion films for generating signal charge (electrons or holes) in response to blue (B) light, green (G) light and red (R) light respectively are laminated successively viewed from a light incidence surface. In addition, this image sensing device has signal reading circuits for independently reading the signal charge optically generated in the photoelectric conversion films respectively in accordance with each pixel. In the case of the image sensing device, almost of the incident light is photoelectrically converted so that utilization efficiency of visible light is almost about 100%. In addition, the image sensing device has such a structure that color signals of the three colors of R, G and B can be obtained in one pixel. Thus, there is an advantage that the image sensing device can obtain a good image with high sensitivity and high resolution (inconspicuous false color).

In an image sensing device described in JP-A-2002-513145 (WO 99/56097), three layers of wells (photodiodes) for detecting optical signals are provided in a silicon substrate so that signals different in spectral sensitivity are taken out in accordance with difference in depth of the silicon substrate. That is, the image sensing device is designed so that a signal having a peak in blue (B) is taken out from a PN junction portion in the surface of the silicon substrate, a signal having a peak in green (G) is taken out from a PN junction portion in an intermediate portion of the silicon substrate and a signal having a peak in red (R) is taken out from a PN junction portion in a deep portion of the silicon substrate. Similarly to the image sensing device described in JP-A-2002-502120 and JP-A-2002-83946, this image sensing device can sense a good image with high sensitivity and high resolution (inconspicuous false color).

In the image sensing device described in JP-A-2002-502120 and JP-A-2002-83946, the three photoelectric conversion films need to be laminated on the substrate, and it is difficult to form vertical wiring by which pixel electrode films provided separately in accordance with the photoelectric conversion films and the pixels are connected to the signal reading circuits provided on the substrate, respectively. There arises a problem that the production process is complex to bring increase in cost and reduction in production yield.

On the other hand, in the image sensing device according to JP-A-2002-513145, separation of spectral sensitivity characteristics of the color signals of R, G and B is not sufficient so that color reproducibility is poor. In addition, it is necessary to add and subtract output signals for obtaining true R, G and B signals. There is a problem that S/N is deteriorated by the addition and subtraction process.

An image sensing device described in JP-A-2003-332551 (corresponding to US Publication 2003/0209651) has been proposed as an image sensing device to solve the problems belonging to JP-A-2002-502120, JP-A-2002-83946 and JP-A-2002-513145. This image sensing device is of a hybrid type between the image sensing device described in JP-A-2002-502120 and JP-A-2002-83946 and the image sensing device described in JP-A-2002-513145. That is, this image sensing device is configured in such a manner that while only one photoelectric conversion film having sensitivity to green (G) light is laminated as an upper layer on a silicon substrate, two PN junction portions (photodiodes) are provided in the silicon substrate so that a blue (B) light signal is taken out from the PN junction portion in a shallow portion of the silicon substrate and a red (R) light signal is taken out from the PN junction portion in a deep portion of the silicon substrate.

Since this image sensing device has only one photoelectric conversion film, there is an advantage that a process for producing the image sensing device is so simple that increase in production cost can be suppressed and reduction in production yield can be almost avoided. In addition, the image sensing device is designed so that green (G) light is absorbed to the photoelectric conversion film so that only blue (B) light and red (R) light can be made incident on the silicon substrate. Thus, separation of spectral sensitivity characteristics of the PN junction portion for blue light and the PN junction portion for red light in the silicon substrate can be improved, so that color reproducibility becomes good and an image with good S/N can be sensed.

SUMMARY OF THE INVENTION

In the hybrid-type image sensing device described in JP-A-2003-332551, like the image sensing device described in JP-A-2002-513145, there is however a problem that an output at dark time (referred to as "dark current") is so large that the image quality of a dark portion of a subject is particularly poor. The reason will be described as follows.

In the image sensing device having the PN junction photodiodes, since the PN junction photodiodes are operated in an inverted bias condition, depletion layers are generated in the PN junction portions. In an image sensing device having photodiodes in a two-layer or three-layer structure, PN junction portions 1 are exposed to the surface of a silicon substrate 2 as shown in FIGS. 5 and 6 (the same as FIGS. 6 and 7 in JP-A-2002-513145).

On the other hand, interfaces between silicon and a silicon oxide film formed in the surface of the silicon substrate are provided in the surface of the silicon substrate 2. A very large number of levels or defects which will serve as sources for generating dark current are present in the interfaces. If depletion layers are generated in the interfaces, dark current increases to a value 10 to 1000 times or more compared with bulk semiconductor. This is the reason why dark current is large in the image sensing device described in JP-A-2002-513145 or JP-A-2003-332551. That is, dark current is large in the image sensing device having the PN junction portions exposed to the surface of the silicon substrate. The dark current (or output at dark time) severs as fixed-pattern noise or random noise, so that image quality is deteriorated remarkably.

An object of the invention is to provide a single plate-type color solid-state image sensing device which can sense a high-quality color image while dark current is reduced.

The invention provides a single plate-type color solid-state image sensing device including: a semiconductor substrate having a surface portion where signal reading circuits and high density impurity regions connected to the signal reading circuits respectively are formed; a blue light detecting photodiode formed in a shallow portion of the semiconductor substrate; a red light detecting photodiode formed in a deep portion of the semiconductor substrate; and a green light detecting photoelectric conversion film which may be laminated as an upper layer on the semiconductor substrate, wherein connection regions which are provided so as to be continued to the photodiodes respectively and exposed to the surface of the semiconductor substrate are formed only in portions adjacent to the high density impurity regions so that electric charge accumulated in each photodiode can be transferred to corresponding one of the high density impurity regions.

The invention provides a single plate-type color solid-state image sensing device including: a semiconductor substrate having a surface portion where signal reading circuits and high density impurity regions connected to the signal reading circuits respectively are formed; a blue light detecting photodiode formed in a shallow portion of the semiconductor substrate; a red light detecting photodiode formed in a deep portion of the semiconductor substrate; and a green light detecting photoelectric conversion film which may be laminated as an upper layer on the semiconductor substrate, wherein the single plate-type color solid-state image sensing device further includes MOS switches for transferring electric charge accumulated in a charge storage layer of each photodiode to corresponding one of the high density impurity regions when a read voltage is applied between the charge storage layer of the photodiode and the corresponding high density impurity region connected to the photodiode.

In the single plate-type color solid-state image sensing device according to the invention, the photoelectric conversion film is formed of organic semiconductor.

In the single plate-type color solid-state image sensing device according to the invention, when an interface where signal charge of minority carriers optically generated in the vicinity of the blue light detecting photodiode branches into a direction toward the surface of the semiconductor substrate and an opposite direction toward the deep side of the semiconductor substrate is regarded as a first interface, and an interface where signal charge of minority carriers optically generated in the vicinity of the red light detecting photodiode branches into the direction toward the surface of the semiconductor substrate and the opposite direction toward the deep side of the semiconductor substrate is regarded as a second interface, the photodiodes are formed in a position where the depth of the first interface from the surface of the semiconductor substrate is from 0.4 μm to 1.1 μm and in a position where the depth of the second interface from the surface of the semiconductor substrate is at least 2.0 μm.

The invention provides a single plate-type color solid-state image sensing device including: a semiconductor substrate having a surface portion where signal reading circuits and high density impurity regions connected to the signal reading circuits respectively are formed; a blue light detecting photodiode formed in a shallow portion of the semiconductor substrate; a red light detecting photodiode formed in a deep portion of the semiconductor substrate; and a green light detecting photodiode formed in an intermediate portion between the shallow portion and the deep portion, wherein connection regions which are provided so as to be continued to the photodiodes respectively and exposed to the surface of the semiconductor substrate are formed only in portions adjacent to the high density impurity regions so that electric charge accumulated in each photodiode can be transferred to corresponding one of the high density impurity regions.

The invention provides a single plate-type color solid-state image sensing device including: a semiconductor substrate having a surface portion where signal reading circuits and high density impurity regions connected to the signal reading circuits respectively are formed; a blue light detecting photodiode formed in a shallow portion of the semiconductor substrate; a red light detecting photodiode formed in a deep portion of the semiconductor substrate; and a green light detecting photodiode formed in an intermediate portion between the shallow portion and the deep portion, wherein the single plate-type color solid-state image sensing device further includes MOS switches for transferring electric charge accumulated in a charge storage layer of each photodiode to corresponding one of the high density impurity regions when a read voltage is applied between the charge storage layer of the photodiode and the corresponding high density impurity region connected to the photodiode.

In the single plate-type color solid-state image sensing device according to the invention, when an interface where signal charge of minority carriers optically generated in the vicinity of the blue light detecting photodiode branches into a direction toward the surface of the semiconductor substrate and an opposite direction toward the deep side of the semiconductor substrate is regarded as a first interface, an interface where signal charge of minority carriers optically generated in the vicinity of the green light detecting photodiode branches into the direction toward the surface of the semiconductor substrate and the opposite direction toward the deep side of the semiconductor substrate is regarded as a second interface, and an interface where signal charge of minority carriers optically generated in the vicinity of the red light detecting photodiode branches into the direction toward the surface of the semiconductor substrate and the opposite direction toward the deep side of the semiconductor substrate is regarded as a third interface, the photodiodes are formed in a position where the depth of the first interface from the surface of the semiconductor substrate is from 0.3 μm to 0.7 μm, the depth of the second interface from the surface of the semiconductor substrate is from 0.8 μm to 1.6 μm and the depth of the third interface from the surface of the semiconductor substrate is at least 2.0 μm.

In the single plate-type color solid-state image sensing device according to the invention, the signal read circuits are formed of MOS transistor circuits or charge transfer paths.

In the single plate-type color solid-state image sensing device according to the invention, a shading film for shading the surface of the semiconductor substrate except photo acceptance surfaces of the photodiodes is laminated on the surface of the semiconductor substrate.

According to the invention, the area of the PN junction portion of each photodiode exposed to the surface of the semiconductor substrate is narrowed or eliminated so that dark current is reduced.

BRIEF DESCRIPTION OF THE DRAWINGS

FIG. 1A is a schematic sectional view of one of unit cells in a single plate-type color solid-state image sensing device according to a first embodiment of the invention, and FIG. 1B is a schematic plan view of a surface portion of a silicon substrate in the single plate-type color solid-state image sensing device according to the first embodiment of the invention.

DETAILED DESCRIPTION OF THE INVENTION

Figure 2:
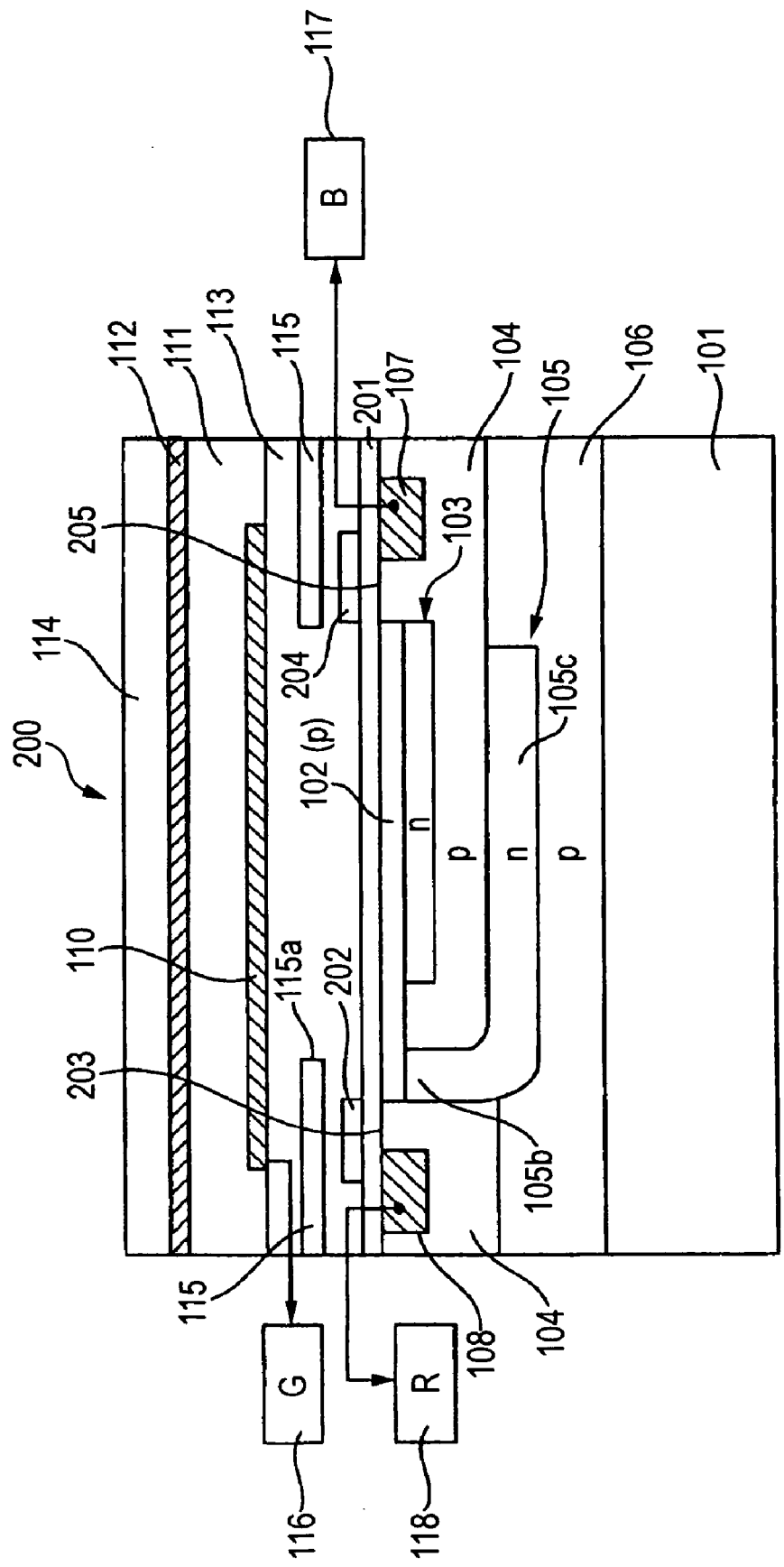
FIG. 2 is a schematic sectional view of one of unit cells in a single plate-type color solid-state image sensing device according to a second embodiment of the invention.

An embodiment of the invention will be described below with reference to the drawings.

First Embodiment

FIG. 1A is a schematic sectional view of one of unit cells in a single plate-type color solid-state image sensing device according to a first embodiment of the invention. FIG. 1B is a schematic plan view of a surface portion of a silicon substrate in the single plate-type color solid-state image sensing device depicted in FIG. 1A. A section taken along the line A-A in FIG. 1B is shown in FIG. 1A. Unit cells as shown in FIG. 1A are arranged two-dimensionally lengthwise and widthwise to form an image sensing device.

A single plate-type color solid-state image sensing device 100 according to this embodiment is of a hybrid type. In the single plate-type color solid-state image sensing device 100, two photodiodes are formed in an n-type silicon substrate 101 so that the quantity of incident blue (B) light and the quantity of incident red (R) light can be detected by the photodiodes respectively. A photoelectric conversion film 111 is laminated as an upper layer on the silicon substrate 101 so that the quantity of incident green (G) light can be detected by the photoelectric conversion film 111.

The configuration of a green (G) light detection portion as the upper layer will be described first. The upper surface of the silicon substrate 101 is covered with a transparent electrically insulating film 113 such as a silicon oxide film. A shading film 115 is buried in the electrically insulating film 113. Openings 115a are provided in the shading film 115 so that blue (B) light and red (R) light can be made incident on photo acceptance surfaces of the two photodiodes (which will be described later) provided in the silicon substrate 101.

A transparent pixel electrode film 110 is laminated on the electrically insulating film 113 so that the openings 115a are covered with the transparent pixel electrode film 110. A signal charge storage portion not shown is formed in a surface portion of the silicon substrate 101. The pixel electrode film 110 is connected to the signal charge storage portion by vertical wiring. A green signal detection portion 116 is connected to the signal charge storage portion. The pixel electrode film 110 is made of a film of a metal compound such as ITO or a very thin metal. The pixel electrode film 110 is separated from pixel electrode films of adjacent pixels.

The photoelectric conversion film 111 is laminated on the pixel electrode film 110. A transparent common electrode film 112 is laminated on the photoelectric conversion film 111. A transparent electrically insulating film 114 which serves as a protective film is further laminated on the common electrode film 112.

The common electrode film 112 is made of ITO, etc. like the pixel electrode film 110. The common electrode film 112 is laminated as a sheet which is common to common electrode films of adjacent pixels. Alternatively, the common electrode film 112 may be provided so as to be separated from common electrode films of adjacent pixels. When a bias voltage is applied between the pixel electrode film 110 and the common electrode film 112, electric charge generated in the photoelectric conversion film 111 can be rapidly transferred from the pixel electrode film 110 to the signal charge storage portion which is not shown but provided for green.

The photoelectric conversion film 111 may be provided as a monolayer film structure or as a multilayer film structure. The photoelectric conversion film 111 is made of an organic or inorganic material containing an inorganic material (silicon, compound semiconductor, nano particles thereof, etc.) chiefly sensitive to green (G), organic semiconductor, organic coloring matter, etc.

The structure of the two photodiodes provided in the n-type silicon substrate 101 will be described next. A p-type semiconductor layer 106 is formed in a portion which is deep in the surface portion of the silicon substrate 101. The p-type semiconductor layer 106 is formed in such a manner that impurities are introduced into the deep portion of the silicon substrate 101, for example, by an ion implantation method and a thermomigration method.

Successively, an ion implantation method is used singly or in combination with a thermomigration method so that an n-type semiconductor layer 105 is formed on the p-type semiconductor layer 106, a p-type semiconductor layer 104 is then formed on the n-type semiconductor layer 105, an n-type semiconductor layer 103, is then formed on the p-type semiconductor layer 104 and a p-type semiconductor layer 102 is then formed in the outermost surface portion of the silicon substrate 101 and on the n-type semiconductor layer 103.

Although the semiconductor layers 105, 104, 103 and 102 are arranged in order shown in FIG. 1A, the order of formation of the semiconductor layers may be the same as the order of arrangement of the semiconductor layers or may be different from the order of arrangement of the semiconductor layers. The p-type semiconductor layer 104 and the p-type semiconductor layer 106 may be formed separately or may be formed so as to be integrated with each other.

A first photodiode for generating photoelectric charge in accordance with the quantity of incident blue light is formed from the p-type semiconductor layers 102 and 104 and the n-type semiconductor layer 103. A second photodiode for generating photoelectric charge in accordance with the quantity of incident red light is formed from the p-type semiconductor layers 104 and 106 and the n-type semiconductor layer 105.

An n-type high density impurity region 107 for blue and an n-type high density impurity region 108 for red are formed in the surface portion of the silicon substrate 101 so as to be located in positions hidden behind the shading film 115. The high density impurity region 107 is connected to a blue signal detection portion 117. The high density impurity region 108 is connected to a red signal detection portion 118.

The n-type semiconductor layer 105 provided in the deep portion of the silicon substrate 101 includes a rectangular flat portion 105c, a charge passage portion 105b, and an exposed surface portion (connection region) 105a. As shown in FIG. 1B, the rectangular flat portion 105c forms a photo acceptance surface. As shown in FIG. 1A, the charge passage portion 105b is provided so as to be erected from an end portion of the flat portion 105c toward the surface of the silicon substrate 101. The exposed surface portion 105a is provided as an end portion on the silicon substrate surface side of the charge passage portion 105b and is connected to the high density impurity region 108 for red.

The charge passage portion 105b is formed separately from the flat portion 105c by an ion implantation method and a thermomigration method. The exposed surface portion 105a is formed so that the exposed surface portion 105a is located in a position hidden behind the shading film 115, and that the area exposed to the surface becomes as small as possible.

The n-type semiconductor layer 103 provided in a shallow portion of the silicon substrate 101 includes a rectangular flat portion 103b, and an exposed surface portion (connection region) 103a. As shown in FIG. 1A, the rectangular flat portion 103b forms a photo acceptance surface. The exposed surface portion 103a extends from an end portion of the flat portion 103b so as to be connected to the high density impurity region 107 for blue. The exposed surface portion 103a is formed so that the exposed surface portion 103a is located in a position hidden behind the shading film 115, and that the area exposed to the surface becomes as small as possible.

The p-type semiconductor layer 102 formed on the flat portion 103b of the n-type semiconductor layer 103 is provided as a thin layer having high impurity density. The reason why the layer is formed to have high impurity density is to prevent a depletion layer of the first photodiode from being spread to the surface of the silicon substrate 101. The reason why the p-type semiconductor layer 102 is made thin is to make it easy to satisfy the condition for a first interface which will be described later.

Though not shown in FIGS. 1A and 1B, MOS transistor circuits, which are used for switches and amplifiers and which constitute the signal detection portions 116, 117 and 118 for respective colors, are also formed in the surface portion of the silicon substrate 101.

When light from a subject is incident on the single plate-type color solid-state image sensing device configured thus, the incident light is first transmitted through the photoelectric conversion film 111. Photoelectric charge is generated in the photoelectric conversion film 111 in accordance with the quantity of incident green (G) light in the incident light. The photoelectric charge is detected by the signal detection portion 116.

In the light incident on the silicon substrate 101, blue light with a short wavelength generates photoelectric charge chiefly in the first photodiode formed in the shallow portion of the silicon substrate 101, while red light with a long wavelength reaches the deep portion of the silicon substrate 101 and generates photoelectric charge in the second photodiode.

The photoelectric charge generated in the first photodiode is accumulated in the semiconductor layer 103, so that a signal corresponding to the quantity of the photoelectric charge is read by the signal detection portion 117 through the high density impurity region 107. The photoelectric charge generated in the second photodiode is accumulated in the semiconductor layer 105, so that a signal corresponding to the quantity of the photoelectric charge is read by the signal detection portion 118 through the high density impurity region 108.

Figure 5:
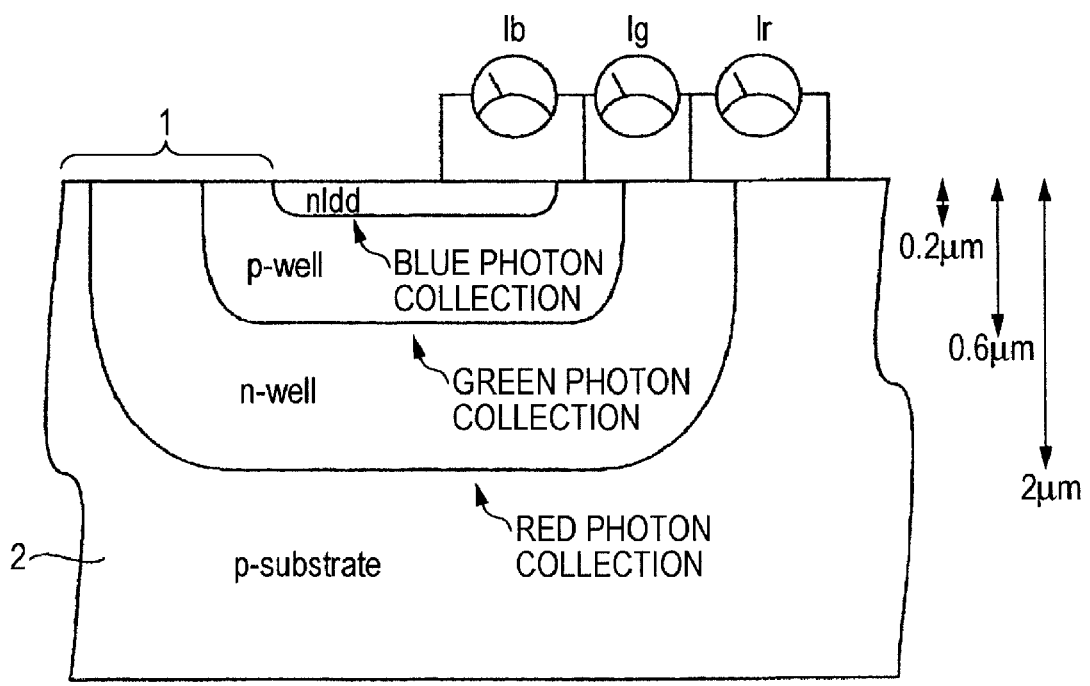
FIG. 5 is a schematic sectional view of one of unit cells in a single plate-type color solid-state image sensing device according to the background art.
Figure 6:
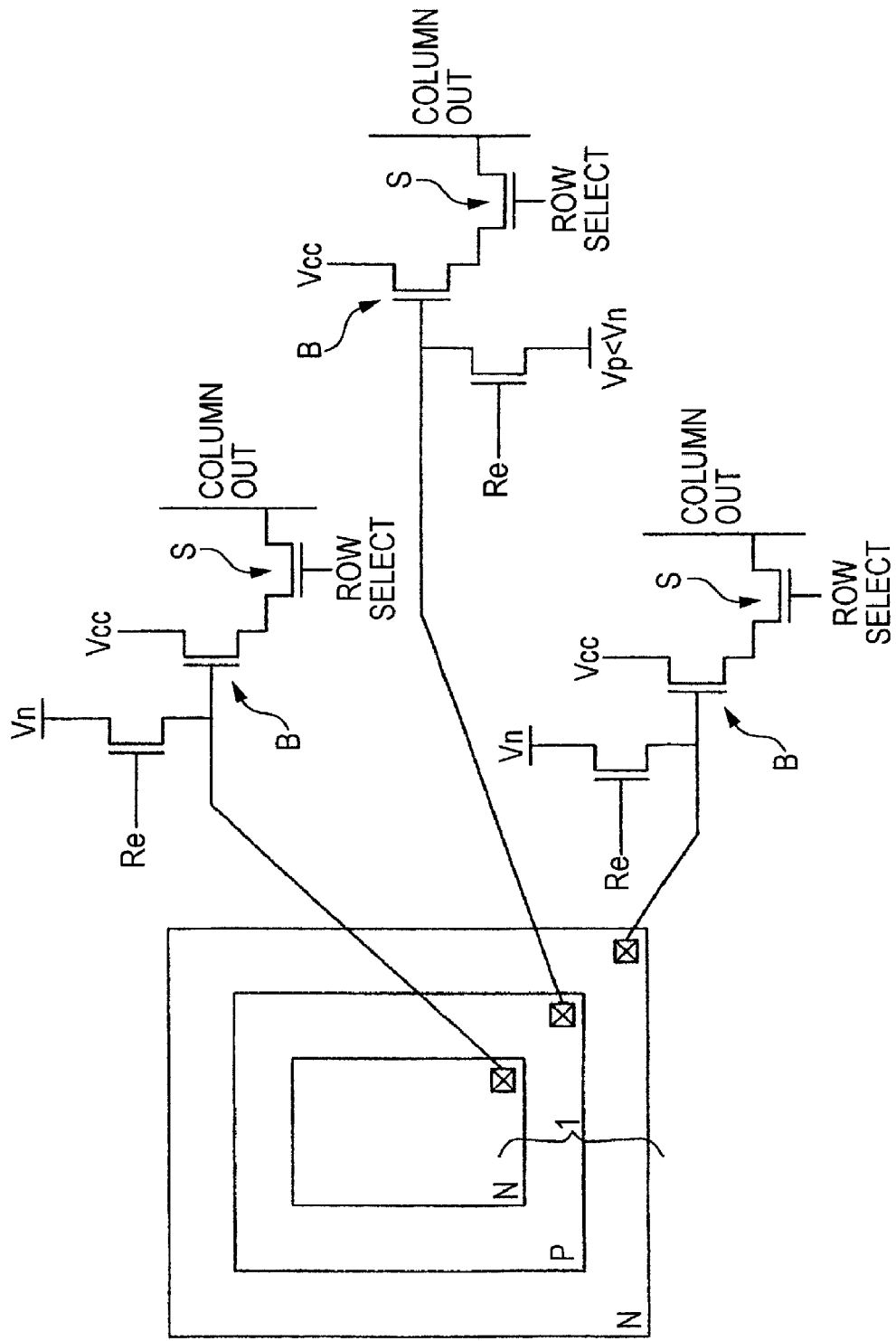
FIG. 6 is a schematic plan view of the single plate-type color solid-state image sensing device according to the background art.

In the single plate-type color solid-state image sensing device according to this embodiment, dark current is reduced. This is because places where PN junction portions of the first and second photodiodes are exposed to the surface of the silicon substrate 101 are limited to the small portions (connection regions) 103a and 105a to be connected to the high density impurity regions 107 and 108 to be connected to the signal detection portions 117 and 118. In this embodiment, dark current is reduced to be not higher than a fraction of dark current in the background art since the exposed area is reduced to be not larger than a fraction of the exposed area in the background art as shown in FIGS. 5 and 6.

A method for achieving optimal spectral sensitivity characteristic by use of the two photodiodes provided in the silicon substrate 101 will be described next.

Figure 4:
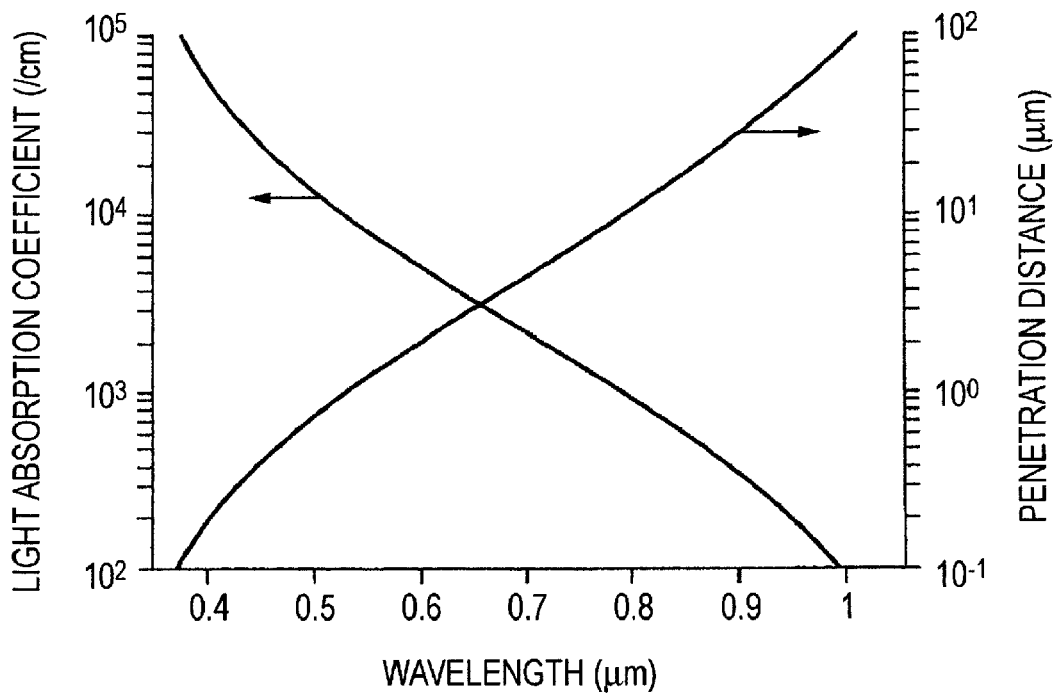
FIG. 4 is a graph showing the light absorption coefficient of silicon.

According to the light absorption coefficient of silicon (e.g. described in JP-A-2002-513145 and shown in FIG. 4), the thickness of silicon allowed to absorb a large part of blue light is in a range of from 0.4 µm to 1.1 µm. The thickness of silicon allowed to absorb red light sufficiently to increase sensitivity to red is preferably 2 µm or more.

A region where electrons generated due to incidence of light from a subject onto the silicon substrate 101 are transferred and accumulated in the first photodiode is from the semiconductor layer 102 to a place where electric potential is locally minimized in an electric potential distribution of the semiconductor layer 104 (local minimum point in the electric potential distribution). Electrons optically generated in the semiconductor layer 102 are transferred to the semiconductor layer 103 by a diffusion effect and accumulated in the semiconductor layer 103. It is a matter of course that electrons optically generated in the semiconductor layer 103 are accumulated in the semiconductor layer 103.

Electrons optically generated in the semiconductor layer 104 on the surface side of the silicon substrate 101 viewed from the local minimum point in the electric potential distribution of the semiconductor layer 104 are transferred to the semiconductor layer 103 by electric potential gradient (electric field) and accumulated in the semiconductor layer 103.

Electrons optically generated in the semiconductor layer 104 on the deep side of the silicon substrate 101 viewed from the local minimum point in the electric potential distribution of the semiconductor layer 104 are prevented from being transferred to the semiconductor layer 103 and accumulated in the semiconductor layer 103 because the electrons are transferred to the semiconductor layer 105 by electric potential gradient (electric field). Accordingly, the position of each photodiode is preferably designed so that a place (first interface) where electric potential is locally minimized in the electric potential distribution of the semiconductor layer 104 to contribute to light absorption is located between a point 0.4 µm deep from the surface of the silicon substrate 101 and a point 1.1 µm deep from the surface of the silicon substrate 101. Thus, sensitivity of the first photodiode to blue light becomes high and color separation between blue and red also becomes good.

For the same reason, the position of each photodiode is preferably designed so that a place (second interface) where electric potential is locally minimized in the electric potential distribution of the semiconductor layer 106 to contribute to light absorption is located to be 2 µm or more deep from the surface of the silicon substrate 101. Thus, sensitivity of the second photodiode to red light becomes high.

Incidentally, it is difficult for peripheral portions of the first and second photodiodes to satisfy the aforementioned condition. For this reason, incidence of light onto these peripheral portions is blocked by the shading film 115 to thereby suppress generation of photoelectric charge. Thus, color mixing can be avoided.

Second Embodiment

FIG. 2 is a schematic sectional view of one of unit cells in a single plate-type color solid-state image sensing device according to a second embodiment of the invention. Constituent parts identical or equivalent to those of the single plate-type color solid-state image sensing device according to the first embodiment are referred to by the same numerals correspondingly, and description only about different parts will be made below.

A single plate-type color solid-state image sensing device 200 according to this embodiment has a gate electrically insulating film 201 formed on an outermost surface of a silicon substrate 101, and a transparent electrically insulating film 113 laminated on the gate electrically insulating film 201.

A charge passage portion 105b is formed in an n-type semiconductor layer 105 so that an upper end portion of the charge passage portion 105b is stopped in position abutting on a p-type semiconductor layer 102. That is, the n-type semiconductor layer 105 has no portion exposed to the surface of the silicon substrate 101. As illustrated in FIG. 2, the semiconductor layer 102 and the charge passage portion 105b are formed so that left end surfaces of them are aligned with each other. A gate electrode 202 extending from the aligned end to an end portion of a high density impurity region 108 is formed on the gate electrically insulating film 201. This gate electrode 202 serves as an MOS switch 203 for connecting the charge passage portion 105b and the high density impurity region 108 to each other. When a read voltage is applied to the MOS switch 203, electric charge accumulated in the semiconductor layer 105 is transferred to the high density impurity region 108.

As illustrated in FIG. 2, an n-type semiconductor layer 103 is formed so that a right end surface of the n-type semiconductor layer 103 is aligned with a right end surface of the semiconductor layer 102. The n-type semiconductor layer 103 has no portion exposed to the surface of the silicon substrate 101. A gate electrode 204 extending from the aligned end to an end portion of a high density impurity region 107 is formed on the gate electrically insulating film 201. This gate electrode 204 serves as an MOS switch 205 for connecting the semiconductor layer 103 and the high density impurity region 107 to each other. When a read voltage is applied to the MOS switch 205, electric charge accumulated in the semiconductor layer 103 is transferred to the high density impurity region 107.

In the color solid-state image sensing device 100 according to the first embodiment, a signal reading circuit is used so that a signal corresponding to electric charge accumulated in the semiconductor layer 103 is read by the signal detection portion 117 through the high density impurity region 107. Similarly, a signal reading circuit is used so that a signal corresponding to electric charge accumulated in the semiconductor layer 105 is read by the signal detection portion 118 through the high density impurity region 108. Each of these signal reading circuits has a three-transistor structure as used in a CMOS image sensor according to the background art.

On the contrary, in the color solid-state image sensing device 200 according to this embodiment, MOS switches 203 and 205 are added to signal reading circuits respectively, so that each signal reading circuit has a four-transistor structure.

When the area of the photo acceptance surface of each photodiode is reduced in accordance with increase in integration density for the purpose of increase in the number of pixels in the color solid-state image sensing device according to the first embodiment, the percentage of the area of each of the exposed surface portions 103a and 105a increases relatively to cause increase in dark current. In the color solid-state image sensing device 200 according to the embodiment, it is however possible to reduce dark current even in the case where integration density increases for the purpose of increase in the number of pixels because there is no exposed surface portion or because an exposed surface portion if the exposed surface portion does exist is in a very narrow range in each aligned end portion.

Third Embodiment

Figure 3:
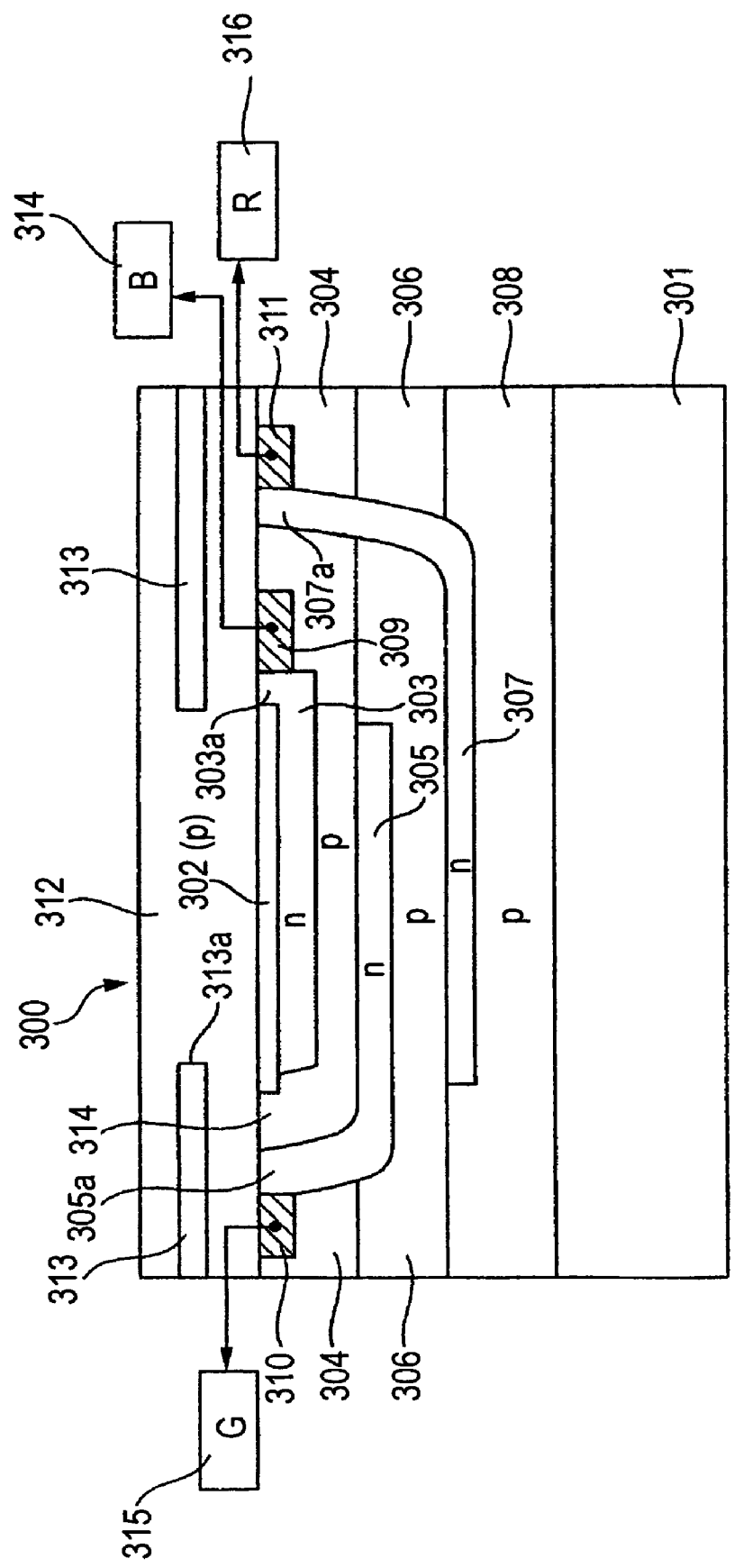
FIG. 3 is a schematic sectional view of one of unit cells in a single plate-type color solid-state image sensing device according to a third embodiment of the invention.

FIG. 3 is a schematic sectional view of a single plate-type color solid-state image sensing device according to a third embodiment of the invention. In a single plate-type color solid-state image sensing device 300 according to this embodiment, three photodiode structures are provided in an n-type silicon substrate 301 so that the three colors of R, G and B are separated and detected. That is, a p-type semiconductor layer 308, an n-type semiconductor layer 307, a p-type semiconductor layer 306, an n-type semiconductor layer 305, a p-type semiconductor layer 304, an n-type semiconductor layer 303 and a p-type semiconductor layer 302 are provided in order viewed from a deep portion of the silicon substrate 301. A transparent electrically insulating film 312 is laminated on the surface of the silicon substrate 301. In addition, a shading film 313 provided with openings 313a is buried in the transparent electrically insulating film 312.

N-type high density impurity regions 309, 310 and 311 are formed in a surface portion of the silicon substrate 301 so as to be located in positions hidden behind the shading film 313. Signal detection portions 314, 315 and 316 for respective colors (B, G and R) are connected to the regions 309, 310 and 311 respectively.

The respective n-type semiconductor layers 303, 305 and 307 extend to the surface side of the silicon substrate 301 in positions hidden by the shading film 313. Exposed surface portions (connection regions) 303a, 305a and 307a of the n-type semiconductor layers 303, 305 and 307 are connected to the high density impurity regions 309, 310 and 311 respectively and correspondingly. The exposed surface portions 303a, 305a, and 307a are formed so that only portions abutting on the high density impurity regions 309, 310 and 311 respectively are exposed to the surface in the same manner as in the embodiment shown in FIG. 1B.

By this configuration, also in the single plate-type color solid-state image sensing device 300 according to this embodiment, dark current is reduced because PN junction portions exposed to the surface of the substrate are small.

In the case of the single plate-type color solid-state image sensing device 300, optimal positions in which the n-type semiconductor layers should be provided are different from those in the first and second embodiments. Interface positions in which signal charge of optically generated minority carriers branches into a direction toward the surface of the silicon and an opposite direction toward the deep side of the silicon are selected so as to coincide with these optimal depths of the silicon. That is, in this embodiment, positions of the photodiodes are designed so that the interface for blue light is about 0.3 μm to 0.7 μm deep, the interface for green light is 0.8 μm to 1.6 μm deep and the interface for red light is 2.0 μm or more deep. Thus, it is possible to sense a color image with good color separation for R, G and B and high sensitivity to red.

In the single plate-type color solid-state image sensing device 300 according to the third embodiment, there is provided the silicon substrate side configuration of the photoelectric conversion film lamination type color solid-state image sensing device 100 shown in FIG. 1A, that is, the exposed surface portions 303a, 305a and 307a the same in structure as the exposed surface portions 103a and 105a for the purpose of reduction in dark current. Similarly, the MOS switches 203 and 205 in FIG. 2 may be applied to the single plate-type color solid-state imaging sensing device in FIG. 3 so that electric charge accumulated in the n-type semiconductor layers 303, 305 and 307 can be transferred to the high density impurity regions 309, 310 and 311 respectively.

Although the aforementioned embodiments have been described on the case where each signal reading circuit is made of MOS transistors by way of example, signal charge accumulated in a corresponding high density impurity region connected to each signal detection portion may be read to the outside of the image sensing device by a charge transfer path in the same manner as a CCD image sensor according to the background art. In addition, the electric conduction types of the silicon substrate and each semiconductor layer are only examples. Any other electric conduction type may be used. For example, a p-type silicon substrate may be used in place of the n-type silicon substrate.

In the single plate-type color solid-state image sensing device according to the invention, dark current is so small that a good color image can be sensed. Accordingly, the single plate-type color solid-state image sensing device according to the invention is useful when it is used as a substitute for the CCD image sensor or the CMOS image sensor according to the background art.

This application is based on Japanese Patent application JP 2005-91732, filed Mar. 28, 2005, the entire content of which is hereby incorporated by reference, the same as if set forth at length.

What is claimed is:

1. A color solid-state image sensing device comprising:
a semiconductor substrate having a surface portion where signal reading circuits and high density impurity regions connected to the signal reading circuits respectively are formed;
a blue light detecting photodiode formed in a shallow portion of the semiconductor substrate;
a red light detecting photodiode formed in a deep portion of the semiconductor substrate; and
a green light detecting photoelectric conversion film,
wherein connection regions which are provided so as to be continued to the photodiodes respectively and exposed to a surface of the semiconductor substrate are formed only in portions adjacent to the high density impurity regions so as to transfer electric charge accumulated in each photodiode to corresponding one of the high density impurity regions.

2. The color solid-state image sensing device as claimed in claim 1, wherein the photoelectric conversion film comprises organic semiconductor.

3. The color solid-state image sensing device as claimed in claim 1, wherein when an interface where signal charge of minority carriers optically generated in the vicinity of the blue light detecting photodiode branches into a direction toward the surface of the semiconductor substrate and an opposite direction toward the deep side of the semiconductor substrate is regarded as a first interface, and an interface where signal charge of minority carriers optically generated in the vicinity of the red light detecting photodiode branches into the direction toward the surface of the semiconductor substrate and the opposite direction toward the deep side of the semiconductor substrate is regarded as a second interface, the photodiodes are formed in a position where the depth of the first interface from the surface of the semiconductor substrate is from 0.4 μm to 1.1 μm and in a position where the depth of the second interface from the surface of the semiconductor substrate is at least 2.0 μm.

4. The color solid-state image sensing device as claimed in claim 1, wherein the signal read circuits are formed of MOS transistor circuits or charge transfer paths.

5. The color solid-state image sensing device as claimed in claim 1, wherein a shading film for shading the surface of the semiconductor substrate except photo acceptance surfaces of the photodiodes is provided on the surface of the semiconductor substrate.

6. The color solid-state image sensing device as claimed in claim 1, wherein the green light detecting photoelectric conversion film is formed as an upper layer on the semiconductor substrate.

7. The color solid-state image sensing device as claimed in claim 6, wherein the blue and red light detecting photodiodes are formed within the semiconductor substrate.

8. The color solid-state image sensing device as claimed in claim 1, wherein the high impurity density regions are disposed within the surface layer of the semiconductor substrate to reduce dark current by preventing a depletion layer of the blue light photodiode from being spread to the surface of the silicon substrate.

9. A color solid-state image sensing device comprising:
a semiconductor substrate having a surface portion where signal reading circuits and high density impurity regions connected to the signal reading circuits respectively are formed;
a blue light detecting photodiode formed in a shallow portion of the semiconductor substrate;
a red light detecting photodiode formed in a deep portion of the semiconductor substrate; and
a green light detecting photoelectric conversion film,
wherein the color solid-state image sensing device further comprises MOS switches for transferring electric charge accumulated in a charge storage layer of each photodiode to corresponding one of the high density impurity regions when a read voltage is applied between the charge storage layer of the photodiode and the corresponding high density impurity region connected to the photodiode.

10. The color solid-state image sensing device as claimed in claim 9, wherein the photoelectric conversion film comprises organic semiconductor.

11. The color solid-state image sensing device as claimed in claim 9, wherein when an interface where signal charge of minority carriers optically generated in the vicinity of the blue light detecting photodiode branches into a direction toward the surface of the semiconductor substrate and an opposite direction toward the deep side of the semiconductor substrate is regarded as a first interface, and an interface where signal charge of minority carriers optically generated in the vicinity of the red light detecting photodiode branches into the direction toward the surface of the semiconductor substrate and the opposite direction toward the deep side of the semiconductor substrate is regarded as a second interface, the photodiodes are formed in a position where the depth of the first interface from the surface of the semiconductor substrate is from 0.4 µm to 1.1 µm and in a position where the depth of the second interface from the surface of the semiconductor substrate is at least 2.0 µm.

12. The color solid-state image sensing device as claimed in claim 9, wherein the signal read circuits are formed of MOS transistor circuits or charge transfer paths.

13. The color solid-state image sensing device as claimed in claim 9, wherein a shading film for shading the surface of the semiconductor substrate except photo acceptance surfaces of the photodiodes is provided on the surface of the semiconductor substrate.

14. The color solid-state image sensing device as claimed in claim 10, wherein the green light detecting photoelectric conversion film is formed as an upper layer on the semiconductor substrate.

15. The color solid-state image sensing device as claimed in claim 14, wherein the blue and red light detecting photodiodes are formed within the semiconductor substrate.

16. The color solid-state image sensing device as claimed in claim 9, wherein the high impurity density regions are disposed within the surface layer of the semiconductor substrate to reduce dark current by preventing a depletion layer of the blue light photodiode from being spread to the surface of the silicon substrate.

17. A color solid-state image sensing device comprising:
a semiconductor substrate having a surface portion where signal reading circuits and high density impurity regions connected to the signal reading circuits respectively are formed;
a blue light detecting photodiode formed in a shallow portion of the semiconductor substrate;
a red light detecting photodiode formed in a deep portion of the semiconductor substrate; and
a green light detecting photodiode formed in an intermediate portion between the shallow portion and the deep portion,
wherein connection regions which are provided so as to be continued to the photodiodes respectively and exposed to a surface of the semiconductor substrate are formed only in portions adjacent to the high density impurity regions so as to transfer electric charge accumulated in each photodiode to corresponding one of the high density impurity regions.

18. The color solid-state image sensing device as claimed in claim 17, wherein when an interface where signal charge of minority carriers optically generated in the vicinity of the blue light detecting photodiode branches into a direction toward the surface of the semiconductor substrate and an opposite direction toward the deep side of the semiconductor substrate is regarded as a first interface, an interface where signal charge of minority carriers optically generated in the vicinity of the green light detecting photodiode branches into the direction toward the surface of the semiconductor substrate and the opposite direction toward the deep side of the semiconductor substrate is regarded as a second interface, and an interface where signal charge of minority carriers optically generated in the vicinity of the red light detecting photodiode branches into the direction toward the surface of the semiconductor substrate and the opposite direction toward the deep side of the semiconductor substrate is regarded as a third interface, the photodiodes are formed in a position where the depth of the first interface from the surface of the semiconductor substrate is from 0.3 µm to 0.7 µm, the depth of the second interface from the surface of the semiconductor substrate is from 0.8 µm to 1.6 µm and the depth of the third interface from the surface of the semiconductor substrate is at least 2.0 µm.

19. The color solid-state image sensing device as claimed in claim 17, wherein the signal read circuits are formed of MOS transistor circuits or charge transfer paths.

20. The color solid-state image sensing device as claimed in claim 17, wherein a shading film for shading the surface of the semiconductor substrate except photo acceptance surfaces of the photodiodes is provided on the surface of the semiconductor substrate.

21. A color solid-state image sensing device comprising:
a semiconductor substrate having a surface portion where signal reading circuits and high density impurity regions connected to the signal reading circuits respectively are formed;
a blue light detecting photodiode formed in a shallow portion of the semiconductor substrate;
a red light detecting photodiode formed in a deep portion of the semiconductor substrate; and
a green light detecting photodiode formed in an intermediate portion between the shallow portion and the deep portion,
wherein the color solid-state image sensing device further comprises MOS switches for transferring electric charge accumulated in a charge storage layer of each photodiode to corresponding one of the high density impurity regions when a read voltage is applied between the charge storage layer of the photodiode and the corresponding high density impurity region connected to the photodiode.

22. The color solid-state image sensing device as claimed in claim 21, wherein when an interface where signal charge of minority carriers optically generated in the vicinity of the blue light detecting photodiode branches into a direction toward the surface of the semiconductor substrate and an opposite direction toward the deep side of the semiconductor substrate is regarded as a first interface, an interface where signal charge of minority carriers optically generated in the vicinity of the green light detecting photodiode branches into the direction toward the surface of the semiconductor substrate and the opposite direction toward the deep side of the semiconductor substrate is regarded as a second interface, and an interface where signal charge of minority carriers optically generated in the vicinity of the red light detecting photodiode branches into the direction toward the surface of the semiconductor substrate and the opposite direction toward the deep side of the semiconductor substrate is regarded as a third interface, the photodiodes are formed in a position where the depth of the first interface from the surface of the semiconductor substrate is from 0.3 µm to 0.7 µm, the depth of the second interface from the surface of the semiconductor substrate is from 0.8 µm to 1.6 µm and the depth of the third interface from the surface of the semiconductor substrate is at least 2.0 µm.

23. The color solid-state image sensing device as claimed in claim 21, wherein the signal read circuits are formed of MOS transistor circuits or charge transfer paths.

24. The color solid-state image sensing device as claimed in claim 21, wherein a shading film for shading the surface of the semiconductor substrate except photo acceptance surfaces of the photodiodes is provided on the surface of the semiconductor substrate.

* * * * *